United States Patent
Keleher et al.

(10) Patent No.: US 7,456,107 B2
(45) Date of Patent: Nov. 25, 2008

(54) COMPOSITIONS AND METHODS FOR CMP OF LOW-K-DIELECTRIC MATERIALS

(75) Inventors: Jason Keleher, Aurora, IL (US); Daniel Woodland, Oswego, IL (US); Francesco De Rege Thesauro, Naperville, IL (US); Robert Medsker, Yorkville, IL (US); Jason Aggio, Bolingbrook, IL (US)

(73) Assignee: Cabot Microelectronics Corporation, Aurora, IL (US)

( * ) Notice: Subject to any disclaimer, the term of this patent is extended or adjusted under 35 U.S.C. 154(b) by 0 days.

(21) Appl. No.: 11/595,536

(22) Filed: Nov. 9, 2006

(65) Prior Publication Data

US 2008/0111101 A1 May 15, 2008

(51) Int. Cl.
*H01L 21/302* (2006.01)
(52) U.S. Cl. .................. 438/692; 438/689; 438/693; 252/79.1; 252/79.2; 252/79.3; 252/79.4
(58) Field of Classification Search .............. 438/692; 252/79
See application file for complete search history.

(56) References Cited

U.S. PATENT DOCUMENTS

| | | | |
|---|---|---|---|
| 5,017,222 A | 5/1991 | Cifuentes et al. | |
| 5,968,238 A | 10/1999 | Healy et al. | |
| 6,420,269 B2 * | 7/2002 | Matsuzawa et al. | 438/693 |
| 6,972,277 B2 | 12/2005 | Dietz | |
| 6,974,777 B2 * | 12/2005 | Moeggenborg et al. | 438/692 |
| 2001/0027018 A1 * | 10/2001 | Molnar | 438/690 |
| 2004/0092102 A1 * | 5/2004 | Li et al. | 438/689 |
| 2005/0009322 A1 * | 1/2005 | Matsui et al. | 438/633 |
| 2006/0207475 A1 * | 9/2006 | Takahashi et al. | 106/285 |

* cited by examiner

*Primary Examiner*—Binh X Tran
*Assistant Examiner*—Maki Angadi
(74) *Attorney, Agent, or Firm*—Thomas E. Omholt; Robert J. Ross; Steven D. Weseman

(57) ABSTRACT

The present invention provides a chemical-mechanical polishing (CMP) composition suitable for polishing low-k dielectric materials. The composition comprises a particulate abrasive material, at least one silicone-free nonionic surfactant comprising a hydrophilic portion and a lipophilic portion, at least one silicone-containing nonionic surfactant comprising a hydrophilic portion and a lipophilic portion, and an aqueous carrier therefor. A CMP method for polishing a low-k dielectric surface utilizing the composition is also disclosed.

19 Claims, 3 Drawing Sheets

COMPOSITIONS AND METHODS FOR CMP OF LOW-K-DIELECTRIC MATERIALS

FIELD OF THE INVENTION

This invention relates to polishing compositions and methods for polishing a substrate using the same. More particularly, this invention relates to chemical-mechanical polishing compositions suitable for polishing low-k dielectric materials.

BACKGROUND OF THE INVENTION

Compositions and methods for chemical-mechanical polishing (CMP) of the surface of a substrate are well known in the art. Polishing compositions (also known as polishing slurries, CMP slurries, and CMP compositions) for CMP of metal-containing surfaces of semiconductor substrates (e.g., integrated circuits) typically contain an abrasive, various additive compounds, and the like.

Polishing compositions for silicon-based inter-metal dielectric layers have been particularly well developed in the semiconductor industry, and the chemical and mechanical nature of polishing and wear of the silicon-based dielectrics is reasonably well understood. One problem with the silicon-based dielectric materials, however, is that their dielectric constant is relatively high, being approximately 3.9 or higher, depending on factors such as residual moisture content. As a result, the capacitance between the conductive layers is also relatively high, which in turn limits the speed (frequency) at which the circuit can operate. Strategies being developed to reduce the capacitance include (1) incorporating metals with lower resistivity values (e.g., copper), and (2) providing electrical isolation with insulating materials having lower dielectric constants relative to silicon dioxide. Such low dielectric constant materials (i.e., "low-k dielectric materials") typically include organic polymer materials, inorganic and organic porous dielectric materials, and blended or composite organic and inorganic materials, which can be porous or non-porous. It would be highly desirable to incorporate low dielectric constant materials into semiconductor structures while still being able to utilize the conventional chemical-mechanical polishing (CMP) systems for polishing the surface of the resulting dielectric material during the semiconductor wafer processing.

Several chemical-mechanical polishing compositions for substrates containing low dielectric constant materials are known. For example, U.S. Pat. No. 6,043,155 discloses a cerium oxide-based slurry for inorganic and organic insulating films. U.S. Pat. No. 6,046,112 discloses a polishing composition for polishing low dielectric materials comprising zirconia abrasive and either tetramethylammonium hydroxide or tetrabutylammonium hydroxide. U.S. Pat. No. 6,270,395 discloses a polishing composition for low dielectric materials comprising abrasive and an oxidizing agent.

Surfactants are commonly used in chemical-mechanical polishing compositions to function as dispersants or flocculating agents. For example, U.S. Pat. No. 6,270,393 discloses an abrasive slurry comprising alumina, an inorganic salt, a water-soluble chelating agent, and a surfactant which purportedly acts as a dispersant for the abrasive. U.S. Pat. No. 6,313,039 discloses a polishing composition comprising an abrasive, an hydroxylamine compound, an oxidizing agent, and optionally a surfactant that purportedly alters the surface charge on the substrate being polished. U.S. Pat. No. 6,348,076 discloses polishing compositions for metal layer CMP comprising surfactants, in particular anionic surfactants. U.S. Published Patent Application 2001/0005009 A1 discloses polishing compositions comprising surfactants, including anionic, cationic, ampholytic, and nonionic surfactants, to act as dispersing agents. U.S. Published Patent Application 2001/0008828 A1 discloses an aqueous polishing composition for copper and barrier film polishing comprising an abrasive, an organic acid, a heterocyclic compound, an oxidizer, and optionally a surfactant. U.S. Published Patent Application 2001/0013507 A1 discloses a method of polishing low dielectric constant inorganic polymer layers comprising zironica abrasive and a nonionic, anionic, cationic, or amphoteric surfactant, which purportedly acts to stabilize the polishing slurry against settling, flocculation, and decomposition. U.S. Pat. No. 6,974,777 discloses certain advantages in the use of nonionic surfactants in CMP of low-k dielectric materials.

WO 01/32794 A1 discloses a tantalum barrier slurry for CMP comprising an organic additive, which can be any of a variety of surfactants, that purportedly forms bonds with the surface of the silica or copper substrate and suppresses formation of silica precipitates and copper staining. EP 810 302 B1 discloses a polishing composition comprising a sorbitan fatty acid ester and a polyoxyethylene derivative of a sorbitan fatty acid ester as corrosion inhibitors. EP 1 088 869 A1 discloses an aqueous dispersion for CMP comprising abrasive particles and an amphipathic surfactant having an HLB value of 6 or lower. EP 1 148 538 A1 discloses a polishing composition comprising cerium oxide abrasive and a surfactant (e.g., anionic, nonionic, cationic, or amphoteric) that purportedly acts as a dispersant.

One major issue in semiconductor polishing, which has been increasing in importance as device dimensions shrink below 90 nm is the ability to control the variation in line resistance (Rs). The Rs value is a measure of the device electrical performance and can be affected by enhanced removal of the metal coupled with the erosion and removal of the low-k dielectric material. Furthermore, this issue is complicated by the fact that the incoming surface functionality of the low-k dielectric material varies across the wafer, as well as from wafer-to-wafer. This typically results in undesired variability during CMP with conventional CMP slurries. The ability to regulate the overall amount of low-k dielectric material removed during CMP can greatly reduce the Rs variability caused by conventional CMP processes.

There is an ongoing need to develop new CMP compositions that are effective for polishing low-k dielectric materials. The present invention provides such improved CMP compositions. These and other advantages of the invention, as well as additional inventive features, will be apparent from the description of the invention provided herein.

BRIEF SUMMARY OF THE INVENTION

The present invention provides a chemical-mechanical polishing (CMP) composition suitable for polishing low-k dielectric materials. The composition comprises a particulate abrasive material, at least one silicone-free nonionic surfactant, at least one silicone-containing nonionic surfactant, and an aqueous carrier therefor.

In some embodiments, the at least one silicone-free nonionic surfactant and the at least one silicone-containing nonionic surfactant are present in the composition in a relative silicone-free:silicone-containing surfactant weight ratio of greater than about 1. The at least one silicone-free nonionic surfactant and the at least one silicone-containing nonionic surfactant the surfactants each preferably are present in the composition in an amount in the range of about 25 to about 10,000 parts per million (ppm).

The silicone-free nonionic surfactant and the silicone-containing nonionic surfactant each have a hydrophilic portion and a lipophilic portion. The hydrophilic portion of each surfactant preferably comprises a polyol group, a polyoxyalkylene group, or a combination thereof. The lipophilic portion of the silicone-free nonionic surfactant preferably comprises a $C_6$-$C_{30}$ hydrocarbon moiety. The hydrocarbon moiety can be branched, linear, and or substituted with one or more functional group (e.g., an ester group, an ether group, an amide group, and the like). The lipophilic portion of the silicone-containing nonionic surfactant comprises a silicone group.

In another aspect, the present invention provides a chemical-mechanical polishing method for polishing a low-k dielectric material. The method comprises the steps of contacting a surface of a low-k dielectric material with a polishing pad and an aqueous CMP composition of the invention, and causing relative motion between the polishing pad and the substrate while maintaining a portion of the CMP composition in contact with the surface between the pad and the substrate for a time period sufficient to abrade at least a portion of the surface of the low-k dielectric material.

DETAILED DESCRIPTION OF THE INVENTION

Figure 1:
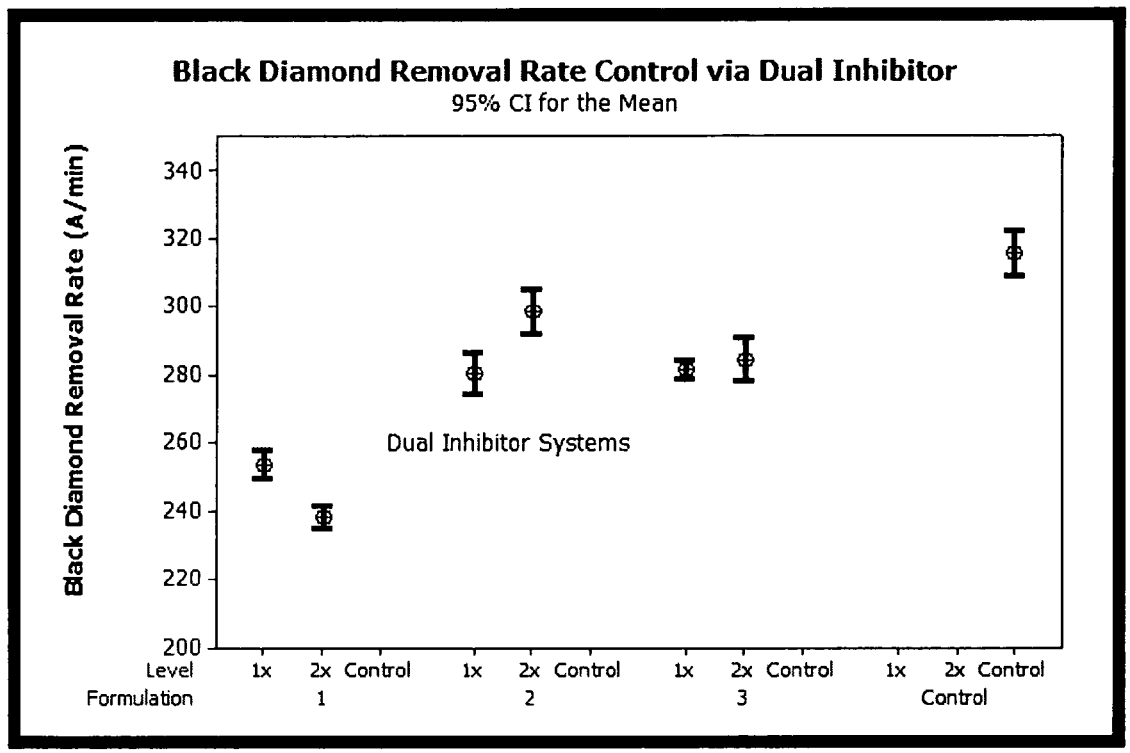
FIG. 1 shows a graph of carbon-doped silicon dioxide (BLACK DIAMOND® low-k dielectric) removal rates achieved in polishing carbon-doped silicon dioxide blanket wafers utilizing compositions of the invention, compared to the rate achieved using a control composition.

The present invention provides a CMP composition useful for polishing a low-k dielectric substrate. The CMP compositions of the invention provide for an even and consistent removal of low-k dielectric materials, such as carbon-doped silicon oxide relative to conventional CMP compositions. The CMP compositions contain a particulate abrasive material, at least one silicone-free nonionic surfactant, at least one silicone-containing nonionic surfactant, and an aqueous carrier, as described herein.

Abrasive materials useful in the CMP compositions of the invention include any abrasive material suitable for use in CMP of semiconductor materials. For example, the abrasive can be a metal oxide abrasive selected from the group consisting of alumina, silica, titania, ceria, zirconia, germania, magnesia, co-formed products thereof, or a combination of two or more of the foregoing abrasives, which are well known in the CMP art. The abrasive can also be a polymer particle or a coated particle. Typically, the abrasive is selected from the group consisting of alumina, silica, co-formed products thereof, coated metal oxide particles, polymer particles, and combinations thereof. Preferably, the abrasive is silica. The CMP compositions of the invention typically comprise about 0.1 to about 20 percent by weight of a particulate abrasive, based on the weight of the total weight of the composition, preferably about 0.5 to about 15 percent by weight, more preferably about 10 to about 15 percent by weight. The abrasive particles preferably have a mean particle size in the range of about 10 nm to about 200 nm, more preferably about 50 nm to about 100 nm, as determined by laser light scattering techniques, which are well known in the art.

The abrasive desirably is suspended in the CMP composition, more specifically in the aqueous component of the CMP composition. When the abrasive is suspended in the CMP composition, the abrasive preferably is colloidally stable. The term colloid refers to the suspension of abrasive particles in the liquid carrier. Colloidal stability refers to the maintenance of that suspension over time. In the context of this invention, an abrasive is considered colloidally stable if, when the abrasive is placed into a 100 ml graduated cylinder and allowed to stand without agitation for a time of 2 hours, the difference between the concentration of particles in the bottom 50 ml of the graduated cylinder ([B] in terms of g/ml) and the concentration of particles in the top 50 ml of the graduated cylinder ([T] in terms of g/ml) divided by the initial concentration of particles in the abrasive composition ([C] in terms of g/ml) is less than or equal to 0.5 (i.e., ([B]−[T])/[C]≦0.5). The value of ([B]−[T])/[C] desirably is less than or equal to 0.3, and preferably is less than or equal to 0.1.

As used herein and in the appended claims, the term "silicone-free nonionic surfactant" encompasses nonionic surfactants that do not include a silicone-based moiety within the chemical structure of the surfactant molecule. The term "silicone-containing nonionic surfactant" encompasses nonionic surfactants that include a silicone group within the chemical structure of the surfactant molecule. Accordingly, the CMP compositions of the invention include at least two different nonionic surfactants, i.e., at least one which includes a silicone group within its chemical structure, and at least one which does not.

Preferably, the CMP compositions comprise about 25 to about 10,000 ppm of at least one silicone-free nonionic surfactant. Similarly, the CMP compositions preferably include about 25 to about 10,000 ppm of at least one silicon-containing nonionic surfactant, more preferably about 25 to about 150 ppm. In some preferred embodiments, the weight ratio of silicone-free:silicone-containing nonionic surfactant present in the composition is greater than about 1 (i.e., there is more silicone-free surfactant by weight, than silicone-containing surfactant). In other embodiments, the ratio of silicone-free:silicone-containing nonionic surfactant present in the composition is selected to be less than about 1:1, particularly when the composition is to be used for polishing a carbon-doped silicon dioxide substrate having a relatively high level of carbon doping.

The silicone-free nonionic surfactant and the silicone-containing nonionic surfactant each have a hydrophilic portion and a lipophilic portion. The hydrophilic portion of each surfactant preferably comprises a polyol group (e.g., a carbohydrate group, such as sorbitan, a polyglyceryl group, and the like), a polyoxyalkylene group (e.g., polyethyleneoxy, polypropyleneoxy, polybutyleneoxy, and copolymers of two or more monomer suntis selected from ethyleneoxy, propyleneoxy, and butyleneoxy monomer units). The lipophilic portion of the silicone-free nonionic surfactant preferably comprises a $C_6$-$C_{30}$ hydrocarbon moiety, such as an alkyl group, an alkyl-substituted aryl group, an aryl-substituted alkyl group, an aryl group, and the like. The hydrocarbon moiety can be branched, linear, and or substituted with one or more functional group (e.g., an ester group, an ether group, an amide group, and the like). The lipophilic portion of the silicone-containing nonionic surfactant comprises a silicone group, such as a polydimethylsiloxane, a fatty alkyl-substituted silicone (e.g., cetyl substituted), and the like.

The silicone-free and silicone-containing nonionic surfactants can comprise any suitable combination of hydrophilic groups and lipophilic groups. For example, the surfactants can comprise only one hydrophilic group in combination with one lipophilic group, or in some embodiments, can comprise multiple (e.g., 2 or more) hydrophilic groups and/or multiple (e.g., 2 or more) lipophilic groups.

Non-limiting examples of silicone-free nonionic surfactants suitable for use in the CMP compositions of the present invention include acetylenic glycol surfactants comprising a tetraalkyldecyne head group and an oxyethylene tail group, such as 2,4,7,9-tetramethyl-5-decyne-4,7-diol ethoxylate. The silicone-free nonionic surfactant also can be selected from the group consisting of polyoxyethylene alkyl ethers and polyoxyethylene alkyl acid esters, wherein the alkyl group comprises a $C_6$-$C_{30}$ alkyl, which can be saturated or partially unsaturated, and is optionally branched. For example, the silicone-free nonionic surfactant can be a polyoxyethylene lauryl ether, polyoxyethylene cetyl ether, polyoxyethylene stearyl ether, polyoxyethylene oleyl ether, polyoxyethylene monolaurate, polyoxyethylene monostearate, polyoxyethylene distearate, or polyoxyethylene monooleate. Similarly, the silicone-free nonionic surfactant can be a polyoxyethylene alkylphenyl ether or a polyoxyethylene alkylcyclohexyl ether, wherein alkyl is a $C_6$-$C_{30}$ alkyl, can be saturated or partially unsaturated, and can be optionally branched, such as a polyoxyethylene octylphenyl ether (octylphenol ethoxylate) or a polyoxyethylene nonylphenyl ether (nonylphenol ethoxylate).

The silicone-free nonionic surfactant also can be a sorbitan alkyl acid ester or a polyoxyethylenesorbitan alkyl acid ester, wherein the alkyl group comprises a $C_6$-$C_{30}$ alkyl, which can be saturated or partially unsaturated, and can be optionally branched. For example, the amphiphilic nonionic surfactant can be sorbitan monolaurate, sorbitan monooleate, sorbitan monopalmitate, sorbitan monostearate, sorbitan sesquioleate, sorbitan trioleate, or sorbitan tristearate, as well as a polyoxyethylenesorbitan monolaurate, polyoxyethylenesorbitan monopalmitate, polyoxyethylenesorbitan monostearate, polyoxyethylenesorbitan tristearate, polyoxyethylenesorbitan monooleate, polyoxyethylenesorbitan trioleate, or polyoxyethylenesorbitan tetraoleate.

Preferred silicone-free nonionic surfactants include polyoxyethylenesorbitan alkyl acid esters (e.g., polyoxyethylenesorbitan monolaurate, polyoxyethylenesorbitan monopalmitate, polyoxyethylenesorbitan sesquioleate, and polyoxyethylenesorbitan trioleate), alkylphenyl polyoxyethylenes (e.g., IGEPAL® surfactants, Rhone-Poulenc), acetylenic diol based surfactants (e.g., SURFYNOL® surfactants, Air Products), and $C_6$-$C_{30}$ alkyl ethoxylates. Particularly preferred silicone-free nonionic surfactants include nonylphenol ethoxylates such as ICONOL® NP40, a 40 mole ethoxylated of nonylphenol, available from BASF Corporation.

Non-limiting examples of suitable silicone-containing nonionic surfactants include block or graft copolymers comprising dimethicone copolyols (e.g., polydimethylsiloxane polymers including polyoxyethylene side chains, polyoxyethylene/polyoxypropylene copolymeric side chains, or polyoxyethylene and polyethylene copolymeric side chains), such as the SILWET® brand of silicone-based nonionic surfactants available from OSi Specialties. Other suitable silicone-containing nonionic surfactants include dimethicone copolyol alkyl ethers (e.g., methyl ether or ethyl ether), alkylmethicone dimethicone copolyols, such as caprylylmethicone dimethicone copolyols, and cetylmethicone dimethicone copolyols), bis-dimethicone copolyols, and the like, which are also available from OSi Specialties.

The relative amounts of silicone-free and silicone-containing nonionic surfactants selected for use in the CMP compositions of the invention to polish a given substrate can be optimized, in part, based on the surface properties of the of substrate being polished. For example, when the low-k dielectric layer is a carbon doped silicon dioxide material, the optimum amount of silicone-free surfactant relative to silicone-containing surfactant depends on the level of carbon doping. Typical carbon-doped silicon dioxide (CDO) low-k dielectric materials have a formula of $Si_wC_xO_yH_z$ where x is approximately (0.10-0.25)y. When x is equal to zero, the material is the same as an undoped silicon dioxide with which the silicone-free nonionic surfactants have little to no interaction. When the silicon dioxide material is modified with organic groups (i.e., x>0), the surface of the substrate becomes increasingly hydrophobic. While not wishing to be bound to theory, it is believed that the hydrophobic nature of the doped silicon dioxide materials drives adsorption of the silicone-free nonionic surfactants onto the surface. At low levels of carbon doping, the optimum ratio of silicone-free:silicone-containing surfactant may be adjusted downward towards 1 or less. As the level of carbon doping increases, the optimum ratio of silicone-free:silicone-containing surfactant may increase.

The CMP compositions of the invention optionally can include one or more oxidizing agent (e.g., to oxidize a component of the semiconductor surface, such as a metal component). Oxidizing agents suitable for use in the CMP compositions and methods of the present invention include, without limitation hydrogen peroxide, persulfate salts (e.g., ammonium monopersulfate, ammonium dipersulfate, potassium monopersulfate, and potassium dipersulfate), periodate salts (e.g., potassium periodate), salts thereof, and a combination of two or more of the foregoing. Preferably, the oxidizing agent is present in the composition in an amount sufficient to oxidize one or more selected metallic or semiconductor material present in the semiconductor wafer, as is well known in the semiconductor CMP art.

The CMP compositions of the invention can also optionally include suitable amounts of one or more other additive materials commonly included in CMP compositions, such as corrosion inhibitors, dispersants, viscosity modifying agents, complexing agents, antioxidants, biocides, and the like, all of which are well known in the CMP art.

In preferred embodiments, the CMP compositions further comprise a biocidal amount of a biocide (e.g., an isothiazolinone composition such as KATHON® biocide, available from Rohm and Haas).

The aqueous carrier can be any aqueous solvent, e.g., water, aqueous methanol, aqueous ethanol, a combination thereof, and the like. Preferably, the aqueous carrier is deionized water.

The CMP compositions of the invention preferably have a pH in the range of about 5 to about 10, more preferably about 8 to about 9.5. The CMP compositions can optionally comprise one or more pH buffering materials, for example, an acid such as hydrochloric acid, acetic acid, and the like, a base such as ammonia, sodium hydroxide, and the like, or a combination thereof.

The CMP compositions of the invention can be prepared by any suitable technique, many of which are known to those skilled in the art. The CMP composition can be prepared in a batch or continuous process. Generally, the CMP composition can be prepared by combining the components thereof in any order. The term "component" as used herein includes individual ingredients (e.g., abrasives, surfactants, and the like) as well as any combination of ingredients. For example, an abrasive can be dispersed in water, and the surfactant components can be added, and mixed by any method that is capable of incorporating the components into the CMP composition. Typically, an oxidizing agent, when utilized, is not added to the CMP composition until the composition is ready for use in a CMP process, for example, the oxidizing agent can be added just prior to initiation of polishing. The pH can be adjusted at any suitable time.

The CMP compositions of the present invention also can be provided as a concentrate, which is intended to be diluted with an appropriate amount of aqueous solvent (e.g., water) prior to use. In such an embodiment, the CMP composition concentrate can include the various components dispersed or dissolved in aqueous solvent in amounts such that, upon dilution of the concentrate with an appropriate amount of aqueous solvent, each component of the polishing composition will be present in the CMP composition in an amount within the appropriate range for use.

The invention also provides a method of chemically-mechanically polishing a semiconductor substrate. The method comprises (i) contacting a surface of a substrate with a polishing pad and a CMP composition of the invention as described herein, and (ii) moving the polishing pad relative to the surface of the substrate with the polishing composition therebetween, thereby abrading at least a portion of the surface to polish the substrate.

The CMP methods of the present invention can be used to polish any suitable substrate, and is especially useful for polishing substrates comprising low-k dielectric materials, such as carbon-doped silicon oxides.

The CMP methods of the present invention are particularly suited for use in conjunction with a chemical-mechanical polishing apparatus. Typically, the CMP apparatus comprises a platen, which, when in use, is in motion and has a velocity that results from orbital, linear, and/or circular motion, a polishing pad in contact with the platen and moving relative to the platen when in motion, and a carrier that holds a substrate to be polished by contacting and moving relative to the surface of the polishing pad. The polishing of the substrate takes place by the substrate being placed in contact with the polishing pad and a CMP composition of the invention and then moving the polishing pad and substrate relative to one another, so as to abrade at least a portion of the substrate to polish the substrate.

A substrate can be planarized or polished with a CMP composition of the invention using any suitable polishing pad (e.g., polishing surface). Suitable polishing pads include, for example, woven and non-woven polishing pads. Moreover, suitable polishing pads can comprise any suitable polymer of varying density, hardness, thickness, compressibility, ability to rebound upon compression, and compression modulus. Suitable polymers include, for example, polyvinylchloride, polyvinylfluoride, nylon, fluorocarbon, polycarbonate, polyester, polyacrylate, polyether, polyethylene, polyamide, polyurethane, polystyrene, polypropylene, coformed products thereof, and mixtures thereof.

Desirably, the CMP apparatus further comprises an in situ polishing endpoint detection system, many of which are known in the art. Techniques for inspecting and monitoring the polishing process by analyzing light or other radiation reflected from a surface of the workpiece are known in the art. Such methods are described, for example, in U.S. Pat. No. 5,196,353 to Sandhu et al., U.S. Pat. No. 5,433,651 to Lustig et al., U.S. Pat. No. 5,949,927 to Tang, and U.S. Pat. No. 5,964,643 to Birang et al. Desirably, the inspection or monitoring of the progress of the polishing process with respect to a workpiece being polished enables the determination of the polishing end-point, i.e., the determination of when to terminate the polishing process with respect to a particular workpiece.

The following examples further illustrate the invention but, of course, should not be construed as in any way limiting its scope.

EXAMPLE 1

This example compares CMP compositions of the invention to a control composition lacking the silicone-containing surfactant for polishing a carbon-doped silicone oxide surface utilizing a bench-top polisher.

Blanket wafers (200 mm carbon-doped silicon dioxide) were polished with six CMP compositions of the invention. Each composition included about 13 percent by weight of colloidal silica, about 5000 ppm of potassium acetate, about 1000 ppm of benzotriazole, about 200 ppm of ICONOL® NP-40, about 1 percent by weight of hydrogen peroxide, and about 75 ppm (1×) or 200 ppm (2×) of a silicone surfactant. Composition (1-1) included about 75 ppm of SILWET® 7001 (a dimethicone copolyol having a 40/60 ratio of ethyleneoxy to propyleneoxy groups in its polyol side chains) (1×). Composition (1-2) included about 200 ppm of SILWET® 7001 (2×). Composition (2-1) included about 75 ppm of SILWET® 7220 (a dimethicone copolyol having a 20/80 ratio of ethyleneoxy to propyleneoxy groups in its polyol side chains) (1×). Composition (2-2) included about 200 ppm of SILWET® 7220 (2×). Composition (3-1) included about 75 ppm of SILWET® 7600 (a dimethicone copolyol having poly(ethylene oxide) side chains) (1×). Composition (3-2) included about 200 ppm of SILWET® 7600 (2×).

The control composition included about 13 percent by weight of colloidal silica, about 5000 ppm of potassium acetate, about 1000 ppm of benzotriazole, about 200 ppm of ICONOL® NP-40), and about 1 percent by weight of hydrogen peroxide.

The wafers were polished at a down-force of about 1.5 psi, a platen speed of about 106 rpm, a carrier speed of about 120 rpm, and a slurry flow rate of about 150 mL/min, using a POLITEX® polishing pad (available from Rodel). The carbon-doped oxide (CDO) removal rates obtained with each composition are shown in FIG. 1. The data in FIG. 1 show that the CMP compositions of the invention afforded a desirably lower CDO removal rate compared to the control composition.

EXAMPLE 2

This example compares a CMP composition of the invention to a control composition lacking the silicone-containing surfactant for polishing a carbon-doped silicone oxide surface utilizing a bench-top polisher.

Figure 2:
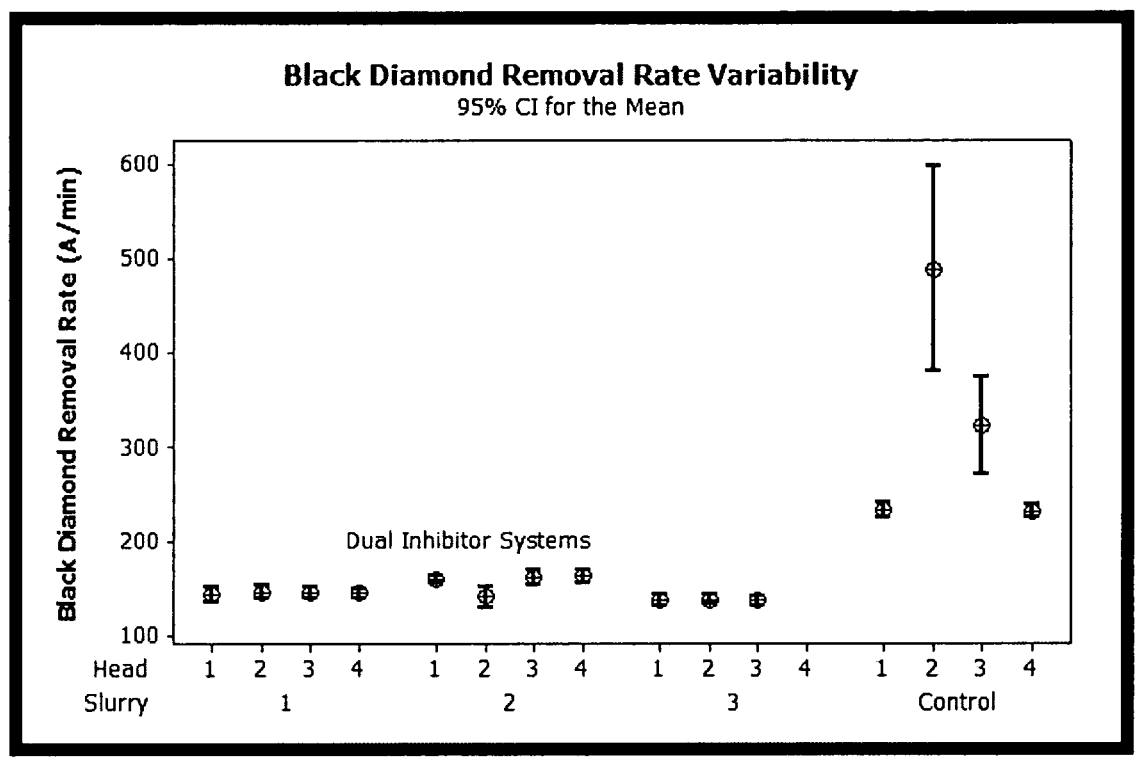
FIG. 2 shows a graph of carbon-doped silicon dioxide (BLACK DIAMOND® low-k dielectric) removal rates achieved in polishing carbon-doped silicon dioxide blanket wafers in replicate polishing runs utilizing a composition of the invention, compared to the rate achieved using a control composition.

Blanket wafers (200 mm carbon-doped silicon dioxide, BLACK DIAMOND® low-k dielectric coated wafers from Applied Materials; "BD") were polished with CMP Composition (1-1) of the invention. The control composition was the same as in Example 1. The wafers were polished on a Mirra polisher with four heads, at a down-force of about 1.5 psi, a platen speed of about 103 rpm, a carrier speed of about 97 rpm, and a slurry flow rate of about 150 mL/min, using a POLITEX® polishing pad. The BD removal rates obtained for three different wafers are shown in FIG. 2. The data indicate an unexpected and highly significant reduction of wafer-to-wafer and head-to-head variability for the composition of the invention, compared to the control.

Figure 3:
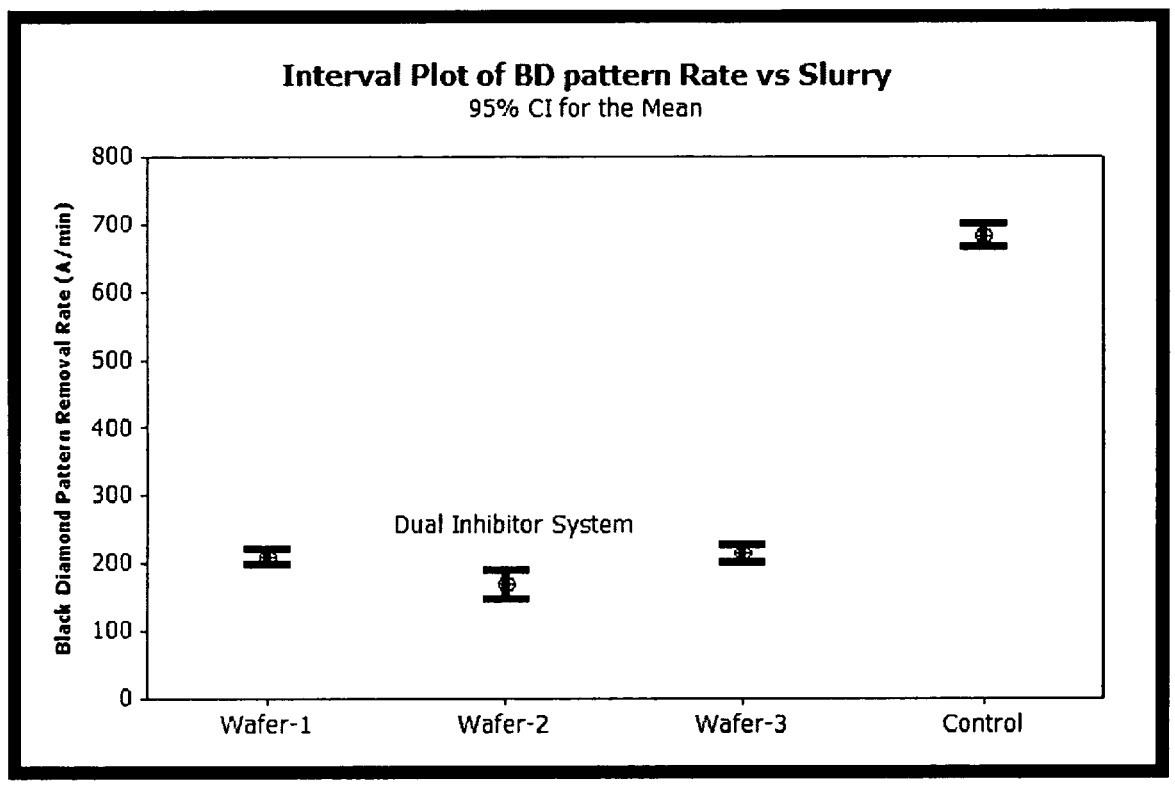
FIG. 3 shows a graph of carbon-doped silicon dioxide (BLACK DIAMOND® low-k dielectric) pattern removal rates achieved in polishing three carbon-doped silicon dioxide pattern wafers with a composition of the invention, compared to the rate achieved using a control composition.

In a separate evaluation, patterned wafers (200 mm, 854 pattern wafers prepared by Sematech, Inc.) were polished with CMP Composition (1-1) of the invention. Comparison was made to the control composition of Example 1. The results for pattern removal rate are shown in FIG. 3. The pattern removal rate was calculated in the field area near a 0.25×0.25 μm line, measured at nine different locations on the wafer from center to edge using an F5 optical measurement system. The wafers were polished on a Mirra polisher, at a down-force of about 1.5 psi, a platen speed of about 103 rpm, a carrier speed of about 97 rpm, and a slurry flow rate of about 150 mL/min, using a POLITEX® polishing pad.

The data in FIG. 3 show that the compositions of the invention provide surprisingly and desirably lower pattern removal rates that the control composition.

All references, including publications, patent applications, and patents, cited herein are hereby incorporated by reference to the same extent as if each reference were individually and specifically indicated to be incorporated by reference and were set forth in its entirety herein.

The use of the terms "a" and "an" and "the" and similar referents in the context of describing the invention (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. Recitation of ranges of values herein are merely intended to serve as a shorthand method of referring individually to each separate value failing within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the invention and does not pose a limitation on the scope of the invention unless otherwise claimed. No language in the specification should be construed as indicating any non-claimed element as essential to the practice of the invention.

Preferred embodiments of this invention are described herein, including the best mode known to the inventors for carrying out the invention. Variations of those preferred embodiments may become apparent to those of ordinary skill in the art upon reading the foregoing description. The inventors expect skilled artisans to employ such variations as appropriate, and the inventors intend for the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

What is claimed is

1. A chemical-mechanical polishing (CMP) composition for polishing a low-k dielectric material, the composition comprising:

(a) a particulate abrasive material;
(b) at least one silicone-free nonionic surfactant comprising a hydrophilic portion and a lipophilic portion, wherein the hydrophilic portion comprises a polyol;
(c) at least one silicone-containing nonionic surfactant comprising a hydrophilic portion and a lipophilic portion; and
(d) an aqueous carrier therefor.

2. The CMP composition of claim 1 wherein the particulate abrasive material is present in the composition in an amount in the range of about 0.5 to about 20 percent by weight.

3. The GMP composition of claim 1 wherein the particulate abrasive material comprises silica.

4. The CMP composition of claim 1 wherein the at least one silicone-free nonionic surfactant and the at least one silicone-containing nonionic surfactant are both present in the composition at concentrations in the range of about 25 to about 10,000 ppm.

5. The CMP composition of claim 1 wherein the at least one silicone-free nonionic surfactant and the at least one silicone-containing nonionic surfactant are present in the composition in a respective silicon-free surfactant-to-silicon-containing surfactant concentration ratio of about 1:1 or greater.

6. The CMP composition of claim 1 wherein the polyol is selected from the group consisting of a polyglycerol, a carbohydrate, and a combination thereof.

7. The CMP composition of claim 1 wherein the hydrophilic portion of the at least one silicone-free nonionic surfactant comprises a $C_2$ to $C_3$ polyoxyalkylene group.

8. The CMP composition of claim 7 wherein the $C_2$ to $C_3$ polyoxyalkylene group is a polyoxyethylene group.

9. The CMP composition of claim 1 wherein the lipophilic portion of the at least one silicone-free nonionic surfactant comprises a $C_6$ to $C_{30}$ hydrocarbon moiety.

10. The CMP composition of claim 9 wherein the $C_6$ to $C_{30}$ hydrocarbon moiety comprises at least one hydrocarbon moiety selected from the group consisting of an alkyl group, an alkyl-substituted aryl group, an aryl-substituted alkyl group, and an aryl group.

11. The CMP composition of claim 1 wherein the hydrophilic portion of the at least one silicone-containing nonionic surfactant comprises a polyol.

12. The CMP composition of claim 11 wherein the polyol is selected from the group consisting of a polyglycerol, a carbohydrate, and a combination thereof.

13. The CMP composition of claim 1 wherein the hydrophilic portion of the at least one silicone-containing nonionic surfactant comprises a $C_2$ to $C_3$ polyoxyalkylene group.

14. The CMP composition of claim 13 wherein the $C_2$ to $C_3$ polyoxyalkylene group is a polyoxyethylene group.

15. The CMP composition of claim 1 wherein the lipophilic portion of the at least one silicone-containing nonionic surfactant comprises a silicone group.

16. The CMP composition of claim 15 wherein silicone group comprises a polydimethylsioxane group.

17. The CMP composition of claim 1 further comprising at least one oxidizing agent.

18. The CMP composition of claim 1 wherein the at least on silicone-free nonionic surfactant comprises a nonylphenol ethoxylate.

19. The CMP composition of claim 1 wherein the at least one silicone-containing nonionic surfactant comprises a dimethicone copolyol.

* * * * *